United States Patent [19]

Burnham et al.

[11] 3,978,428

[45] Aug. 31, 1976

[54] BURIED-HETEROSTRUCTURE DIODE INJECTION LASER

[75] Inventors: Robert D. Burnham; Donald R. Scifres, both of Los Altos, Calif.

[73] Assignee: Xerox Corporation, Stamford, Conn.

[22] Filed: June 23, 1975

[21] Appl. No.: 589,120

[52] U.S. Cl. .............................. 331/94.5 H; 357/16; 357/18
[51] Int. Cl. ............................................. H01s 3/19
[58] Field of Search ................. 331/94.5 H, 94.5 C; 357/16, 18

[56] References Cited
UNITED STATES PATENTS

| | | | |
|---|---|---|---|
| 3,780,358 | 12/1973 | Thompson | 331/94.5 H X |
| 3,783,351 | 1/1974 | Tsukada et al. | 331/94.5 H X |
| 3,824,493 | 7/1974 | Hakki | 331/94.5 H |
| 3,849,790 | 11/1974 | Gottsman | 331/94.5 H X |
| 3,920,491 | 11/1975 | Yonezu | 331/94.5 H X |

OTHER PUBLICATIONS
Casey et al., Journal of Applied Physics, vol. 45, No. 1, Jan., 1974, pp. 322–333.
Tsukada, Journal of Applied Physics, vol. 45, No. 11, Nov., 1974, pp. 4899–4906.

Primary Examiner—Robert J. Webster
Attorney, Agent, or Firm—M. J. Colitz, Jr.; T. J. Anderson; Leonard Zalman

[57] ABSTRACT

A buried-heterostructure (BH) diode injection laser capable of operating at low room temperature thresholds and in the lowest order TE, TM or TEM modes. The laser has an elongated groove in a substrate with the groove extending through a pump current confining layer with a central portion of the active layer substantially completely within the groove and substantially completely surrounded by light guiding and carrier confining layers of material having a lower index of refraction than the index of refraction of the material of the active layer. The light guiding and carrier confining layer in contact with the substrate has a central depression within the elongated groove and the central portion of the active layer is bowl-shaped and within the depression such that light waves produced by carrier recombination within the central portion of the active layer when the laser is forward biased are guided in the central portion of the active layer such that the laser produces a light beam having reduced width v. height dimensional variations such that the light beam can be used with symmetrical optical elements such as round lenses.

23 Claims, 7 Drawing Figures

BURIED-HETEROSTRUCTURE DIODE INJECTION LASER

BACKGROUND OF THE INVENTION

In order to lower the threshold current density of a double heterojunction diode laser below the critical limit for CW operation, it is necessary to have the thickness of the active layer on the order of 0.5 microns or less. The usual cleaved and sawed double heterojunction lasers have cross-sectional areas which are typically on the order of 0.2 × 20 microns. To make the laser beam produced by heterojunction diode lasers compatible with optical systems utilizing round lenses, or other symmetric optical elements, it is desirable to reduce the large dimensional unbalance between active area width and thickness from the order of several hundred to one to as close to a one to one ratio as possible, with a five to one ratio being satisfactory.

Recently, a double heterojunction diode laser was disclosed in which the width of the filamentary area of the active layer was substantially reduced. The disclosed diode laser is called a buried-heterostructure (BH) injection laser since the filamentary active laser region is completely surrounded by a region of lower index of refraction material, that is, surrounded by GaAlAs when the active region is GaAs. The typical fabrication process for the disclosed BH laser is composed of four main steps: (i) a liquid phase epitaxial growth step to produce on on a GaAs substrate a first GaAlAs layer, an active layer of GaAs, and a second GaAlAs layer, (ii) a mesa etching step which removes part of the two GaAlAs layers and part of the GaAs layer to define the active filamentary area, (iii) a second liquid phase epitaxial growth step to provide a GaAlAs layer around the mesa to thereby completely surround the active filamentary area with material having a lower index of refraction than that of the active filamentary area, that is, burying or surrounding the active filamentary area with GaAlAs when the active region material is GaAs, and, finally (iiii) a selective diffusion of a p-type dopent (zinc) to provide a p-type channel from the non-substrate end of the device to the GaAlAs layer adjacent the active filamentary area. The last step requires that an apertured masking layer be formed on the non-substrate end of the device with the aperture in precise alignment with the top of the mesa.

The described process has the readily apparent disadvantage of requiring two separate epitaxial growth steps. Another disadvantage is that several layers of varying composition and thickness must be etched, or otherwise removed, and these variances make the etching or removal difficult to control. A further disadvantage is that subsequent to the etching step and prior to the second epitaxial growth, the exposed surfaces of the mesa can get oxidized because of the problem of aluminum contamination with such contamination creating defects in the active filamentary area. Also, the second epitaxial growth can cause melt back of the regions formed by the first epitaxial growth with the likelihood of further defects in the active region.

As noted, the zinc diffusion of the described process to form a non-rectifying channel to the GaAlAs layer on the non-substrate end of the active filamentary area, must be through a masking aperture which is precisely aligned with the mesa top. Such alignment is difficult to maintain because the top of the mesa is hidden by the second epitaxial growth layers and because tolerances of better than a micron must be maintained. In further reference to the zinc diffusion, the diffused region must extend through a relatively thick (5 micron) GaAlAs layer and terminate in a relatively thin (1 micron) GaAlAs layer. If the diffusion is note deep enough a rectifying barrier will be created that will prevent pump-current flow and if the diffusion is too deep the active region (0.5 microns thick) could be penetrated. The zinc diffusion is hard to control due to the different thicknesses between layers, as discussed, and also due to the varying thickness of each layer. Thus, the zinc diffusion must be controlled extremely accurately. Another difficulty with the mesa producing process is that the mesa is a very long, thin plateau which is easily disturbed, that is, chipped or broken off during the subsequent epitaxial growth and zinc diffusion steps.

OBJECTS OF THE INVENTION

It is an object of the invention to provide an improved laser.

It is a further object of the invention to provide an improved buried-heterojunction diode laser.

It is a further object of the invention to provide an improved buried heterojunction diode laser capable of operating at low room temperature thresholds and in the lowest order TE, TM or TEM modes.

It is a further object of the invention to provide an improved laser having an output beam compatible with symmetrical optical elements.

SUMMARY OF THE INVENTION

A buried-heterojunction (BH) diode laser is provided which is capable of operating at room temperature thresholds and at the lowest order TE, TM, or TEM mode. The BH diode laser is characterized by an active region which is completely surrounded (buried) by material of lower index of refraction and higher band gap. The filamentary area of the active region is substantially bowl-shaped, that is, thicker in the middle than at the ends and is substantially completely within an elongated channel of the laser substrate. This filamentary area configuration and placement is effective to favor emitted light in the central portion of the active region which permits the width of the light beam produced to be small (1–2 $\mu$) and thus, provides a laser having a fairly symmetrical light output beam with lowest order transverse modes in both directions and threshold currents as low as 10 milliamps.

The BH diode laser is made by a process in which the filamentary area of the active layer is formed substantially within a groove etched in the diode substrate. First, a p-type surface layer is provided in the n-type substrate to provide, subsequently, a current blocking junction. Next, an elongated groove is etched in the substrate to a depth deeper than the surface layer thickness. Following formation of the groove, a layer of a light guiding and carrier confining material, a layer of active region material and a second layer of light guiding and carrier confining material are grown successively on the grooved surface of the substrate by conventional liquid phase epitaxial growth or molecular beam epitaxy, with the active region being doped such that it forms a rectifying junction with one of the light guiding layers. Due to the shape of the groove, nucleation sites for the first growth layer are more prevalent near the bottom extremities of the groove than at other portions of the groove and thus the first growth layer has a depressed central area which is filled in by the growth of the active material layer to provide an active region having a bowl-shaped filamentary area.

DESCRIPTION OF THE PREFERRED EMBODIMENT

Figure 1:
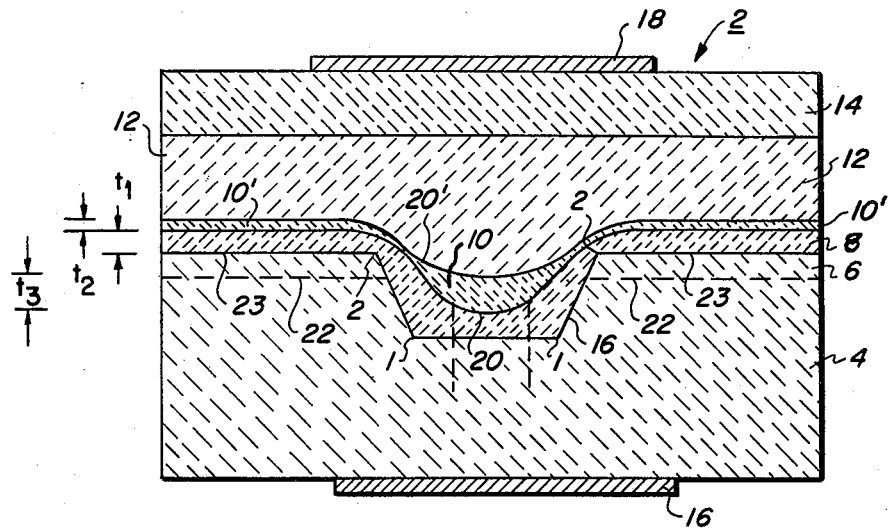
FIG. 1 is an end view of a BH laser in accordance with the invention.

Referring now to FIG. 1, there is shown an end view of a BH diode laser 2 in accordance with the invention. Laser 2 includes a substrate 4, a diffused layer 6, a first light wave guiding and carrier confining layer 8, an active material layer having central portion 10 and end portions 10', a second light wave guiding and carrier confining layer 12, and a contact-facilitating layer 14. The central portion of the layer 8 and the central portion 10 of the active material layer are within a groove 16 formed in the substrate 4 and extending through the diffused layer 6. Groove 16 is defined by lower extremities 1 and upper extremities 2.

Layer 8 and active material layer 10'–10–10' are of different conductivity type to provide a rectifying junction 20 therebetween. Contacts 16 and 18 are provided in contact with substrate 4 and layer 14, respectively, to provide means for forward biasing rectifying junction 20 at the interface of layer 8 and active material layer 10'–10–10'. Layers 4 and 8 are of different conductivity type than layer 6 such that second and third rectifying junctions 22 and 23 exist at the interface between layers 4 and 6 and 6 and 8, respectively. When junction 20 is forward biased, junction 22 is also forward biased and junction 23 is back biased. More specifically, substrate 4 can be n-type GaAs, layer 6 can be p-type GaAs, light wave guiding and carrier confining layer 8 can be n-type GaAlAs, active layer 10'–10–10' can be p-type GaAs, light wave guiding and carrier confining layer 12 can be p-type GaAlAs, and contact-facilitating layer 14 can be p-type GaAs. Layer 10'–10–10' can be n-type GaAs in which case a rectifying junction 20' would exist between the layer of active material 10'–10–10' and layer 12, and layer 10'–10–10' can be undoped to provide a rectifying junction somewhere intermediate layers 8 and 12.

As discussed in detail hereinafter, the bowl-shape of the central portion 10 of the active material layer is controlled, in part, by the shape of the first light wave guiding and carrier confining layer 8 which has a central trough or elongated depression 8' which results from the groove 16 and the tendancy for nucleating atoms to attach themselves more readily at places that require less energy for bonding, which, in fact, are those places which have the highest density of neighboring atoms. From FIG. 1, it can be seen that the groove angles at lower extremities 1 are about 125° whereas the groove angles at upper extremities 2 are about 235°. Thus, there is a higher density of neighboring atoms at lower extremities 1 than at upper extremities 2 and hence nucleation and incorporation of growth material into the substrate lattice can occur more easily at lower extremities 1 than at upper extremities 2. Other nucleation control factors will be discussed when the method of making the diode 2 is described.

Figure 2:
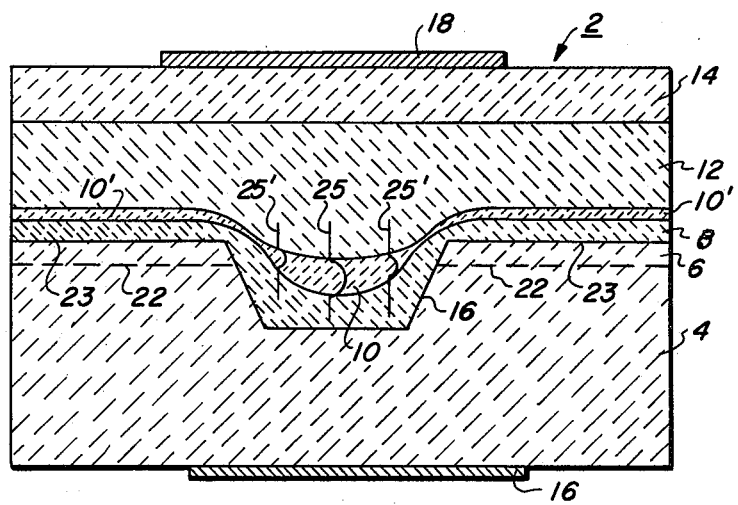
FIG. 2 is a symbolic representation of light wave energy distribution in the laser of FIG. 1.

As noted, the central portion 10 of the active material layer has a bowl-shaped cross-section, being deeper in the central region and very shallow adjacent the upper extremities 2. Since the light beam rays generated as a result of the recombination of carriers when junction 20 is forward biased are guided by material having a high index of refraction than adjacent layers 8 and 12, the filamentary area of the laser, defined symbolically as existing between lines 10a and 10b, is confined to the central portion 10 of the active material layer. Referring to FIG. 2, the emitted light energy distribution pattern is illustrated symbolically by light energy distribution patterns 25 and 25' for the center and ends, respectively, of the bowl-shaped, central portion 10 of the active material layer. A majority of the laser light emitted is concentrated in the middle of central portion 10, that is, within the filamentary area defined by lines 10a and 10b. Since the filamentary area has a maximum depth on the order of 1 micron and a width of about 1–2 microns, the laser output beam produced by laser 2 has an approximately round shape which makes it compatible with external round lenses thereby eliminating the need for complicated lens arrangement which are required with lasers having a mesa structure, as previously described.

Figure 3A:
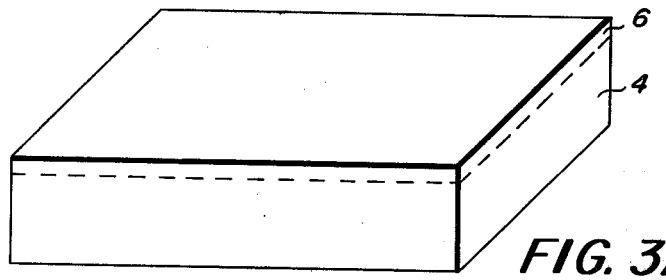
FIG. 3A–3E shows various process steps in the production of the laser of FIG. 1.
Figure 3B:
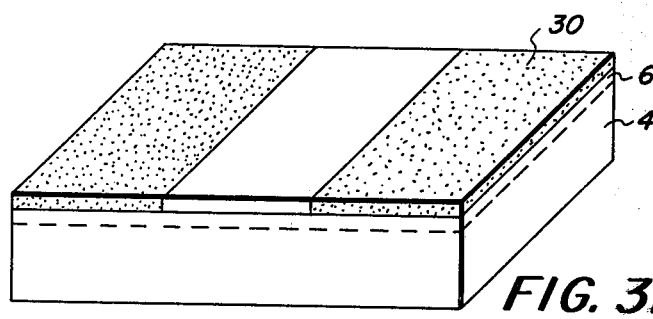
Figure 3C:
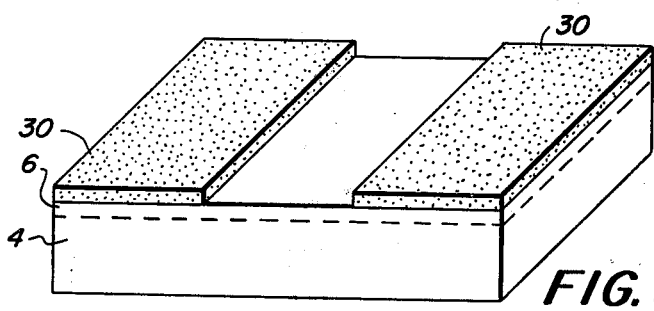

The laser 2 of FIG. 1 is made by a process which requires only a single epitaxial growth step, which can be a liquid phase epitaxial growth or a molecular beam epitaxial growth. The process is initiated by placing in a diffusion ampoule the substrate 4 which as previously noted can be n-type GaAs and a p-type dopent, such as zinc, and diffusing the dopent into the substrate 4 to form p-type region 6, as shown in FIG. 3A. Substrate 4 preferably has a dopent level of $1-5 \times 10^{18}/cm^3$ and layer 6 preferably has a doping level slightly greater than the doping level of substrate 4. Next a layer of a conventional photoresist, such as the ultraviolet sensitive photoresist Shipley AZ 1350 is deposited over the layer 6 followed by exposure of the resist, as shown in FIG. 3B, wherein the dotted portions of resist layer 30 has been exposed making those portions insensitive to a reagent, such as Shipley developer when the photoresist is Shipley AZ 1350. The unexposed portion of the photoresist, which can be 1–2 microns in width or still smaller, is then removed such as by immersion of the substrate wafer of FIG. 3B in a bath of a suitable photoresist developer reagent to provide the structure of FIG. 3C. A groove or channel 16 is then formed in the substrate 4 in the area not protected by resist 30 to provide the substrate wafer configuration of FIG. 3D. The depth of groove 16 is not critical but it is necessary that the groove 16 extend through the layer 6 in the substrate 4. For example, layer 6 can be 0.6 microns thick in which case groove 16 would be about 1.5 microns deep. The depth of layer 6 is not critical and the depth of groove 16 is also not critical, for example, layer 6 can have a thickness range from 0.1 to 2 microns or more and groove 16 can be 0.2 to 2.5 microns or more deep, provided that groove 16 extends through layer 6 in substrate 4. Groove 16 can be formed by conventional chemical etching, ion milling or a combination of these techniques or other known techniques for removing the substrate material. When the substrate material is as previously specifically specified, that is, GaAs, an etch bath composed of 20 parts ethylene glycol, 5 parts phosphoric acid, and 1 part hydrogen peroxide is satisfactory, with the etch bath maintained at room temperature and with the etch bath being stirred during the etching process.

Figure 3D:
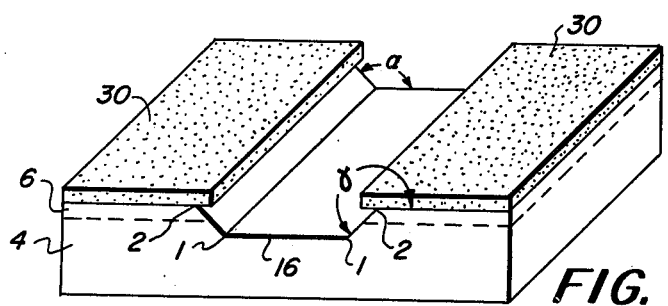

Since p-type material (the material of layer 6) etches faster than n-type material (the material of substrate 4), the etched groove 16 takes on the sloping sidewall configuration of FIG. 3D, with the sloping walls having a (111) A or GaAs plane atomic surface and the top surface of substrate 4 having a (100) crystallographic orientation. The upper width of the groove 16 is controlled by the opening in the resist 30, and due to undercutting of the resist 30 by the etch bath, the upper width of groove 16 can be slightly wider than the opening of resist 30. The width of the bottom of the groove 16 will depend greatly upon groove depth but is generally on the order of the width of the opening in the resist 30. It is noted again that the angle $\alpha$ formed between each of the sidewalls and the bottom of the groove 16, that is, at lower extremities 1 is less than 180° whereas the angle $\gamma$ formed between the sidewalls and the top of the layer 6, that is, at the upper extremities 2 is greater than 180°. These angles are important for nucleation site purposes.

Figure 3E:
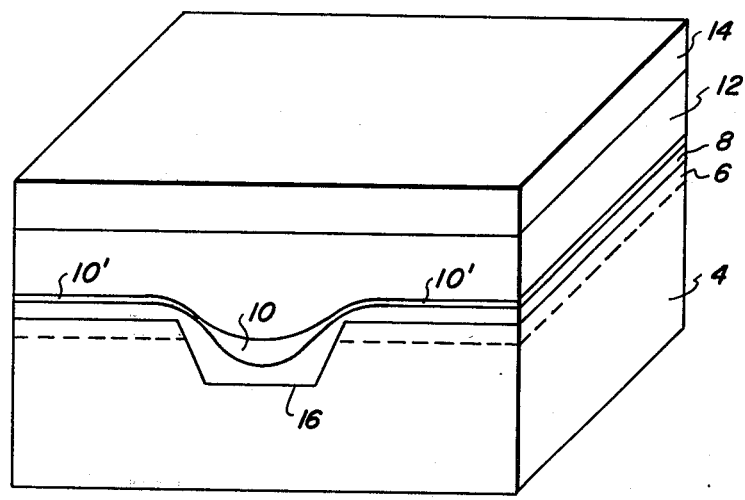

Following formation of groove 16, the remaining photoresist 30 is removed from the substrate wafer configuration of 3D and the layers 10'–10–10', 12 and 14 are grown consecutively by means of conventional liquid phase epitaxial growth to produce the device of FIG. 3E. Other methods of layer growth could also be used such as molecular beam epitaxy. The layer 8 has a depressed region in channel 16 due, in part, to the prevalence of nucleation sites at extremities 1 which cause a greater growth rate at those extremities. Layer 8 could have a thickness $t_1$ adjacent to layer 6 of about 1 micron, although it could have a thickness range of 0.5 to several microns. It is important, however, that the growth of layer 8 be terminated before the depressed central area is smoothed over. The portions 10' of the active material layers are substantially planar with a width $t_2$ of about 0.2 microns (although a range of $t_2$ from 0.1 to 1 micron or more is acceptable) and the central portion 10 of the active material layer is bowl-shaped and within the groove 16. When thickness $t_2$ is 0.2 microns, the thickness $t_3$ of the bowl-shaped central portion 10 would be about 0.4–0.8 microns. Once again, the configuration of the bowl-shaped central portion 10 of the active material layer is controlled by nucleation sites on layer 8 with such sites being greater in the depressed central area of layer 8. Actually, the reasons layers 8 and 10'–10–10' grow as they do is dependent upon other factors besides nucleation sites. Some of these factors, which are well known to those versed in the semiconductor fabrication art, are depth of groove 16, width of groove 16, depth of diffusion of layer 6, crystallographic orientation of substrate 4, growth times, growth temperatures, cooling rates, degree of clean wiping melts, and whether the melts are saturated or super saturated. The growth of the active material layer 10'–10–10' can be continued until the entire top surface is substantially smooth, however, this additional growth will substantially increase the width of the active material that will provide guiding of the light beam produced by carrier recombination, that is, increase the width of the filamentary area, and thus the width of the output laser beam will be substantially greater than the height of the output laser beam thereby making symmetric optical elements uncompatible.

The GaAlAs layer 12 is typically 1.5 microns thick although the thickness range may be from 1 to 3 microns or more. Layer 14 is typically 1–4 microns thick and substrate 4 is typically 100 microns thick. The concentration of aluminum in layers 8 and 12 is typically 0.4, although a range from 0.15 to 0.7 is acceptable. The doping levels of layers 10, 12 and 14 are typically $10^{16}$–$10^{17}$/cm$^3$, $10^{17}$–$10^{18}$/cm$^3$, and $10^{17}$–$10^{19}$/cm$^3$, respectively. The process is completed by applying electrodes 16 and 18 in a conventional manner. The method is also directly applicable to the fabrication of optical waveguides, modulators, directional couplers and other integrated optical components.

In operation, when the diode 2 is forward biased, that is, by applying a voltage to electrode 18 of approximately 1.4 volts greater than the potential applied to electrode 16, the junction 20 (or the junction 20' when the active material is n-type) is forward biased and electrons are injected from the central portion of layer 8 into the bowl-shaped central portion 10 of the active layer and are confined there by the surrounding heterojunction layers 8 and 12. With sufficient pump current, population inversion is achieved and gain is obtained with light produced by radiative recombination of the carriers in layer 10. This light is guided by layers 8 and 12 due to the lower index of refraction of these layers relative to that of layer 10.

Pump current flow is restricted to a path through channel 16 due to the back bias on junction 23 when the junction 20 is forward biased. This pump current path confinement could be achieved by other than diffusion techniques. For example, substrate 4 can be provided with an intrinsic layer instead of layer 6, or protron implantation could be used to create insulated regions in place of layer 6. Also, by selective growth, layer 6 could be grown instead of diffused.

The laser disclosed is capable of operating at low room temperature thresholds (approximately 10 milliamps) and operating in the lowest order TE, TM or TEM modes. What makes this operation possible is that the central portion 10 of the active layer is completely or almost completely surrounded (buried) in the groove 16 by layers 8 and 10 of lower index or refraction material. The pump current is substantially restricted to a flow path through the central portion 10 of the active layer within the groove 16 because regions 6 provide p-n junctions 23 which are back biased when diode laser is forward biased for pumping mainly the "buried" portion of the active region of the diode laser. The major advantage of this structure is that most of the carriers for radiation recombination are injected into the "buried," bowl-shaped region 10 of the active layer and substantially all of the light waves produced can be confined to the bowl-shaped region 10 of the active layer, and more particularly to the filamentary area of the active layer because the effective index of refraction of the active layer decreases as the active layer thickness decreases. Thus, the light waves produced tend to be focused in the center of the "buried" active layer because that is where the active layer is thickest and thus has the highest index of refraction. Accordingly, by controlling active region geometry, it is possible to provide CW room temperature lasers with lowest order transverse modes in both directions and threshold currents as low as 10 milliamps.

What is claimed is:
1. A heterojunction diode laser comprising:

a substrate body having a surface with an elongated groove formed in said surface, a first layer of a first material deposited on said surface, said first layer having a surface configuration remote from said surface of said substrate with a portion which is concave toward said substrate within a substantial portion of said groove, a second layer of a second material deposited on said first layer, said second material having a index of refraction greater than said first material, said second layer having substantially planar portions on both sides of said groove and a substantially bowl-shaped portion substantially within said groove and in contact with said concave portion of said surface of said first layer remote from said substrate, a third layer of a third material deposited on said second layer, said third material having a lower index of refraction than said second material, said second layer having a conductivity type different from either said first layer or said third layer such that a first rectifying junction exist at the interface between said second layer and either said first layer or said third layer, and means located on both sides of said groove formed in said surface of said substrate for restricting the flow of pump current to a path through said groove and through said bowl-shaped portion of said second layer when said rectifying junction is forward biased to thereby achieve population inversion in said bowl-shaped portion of said second layer such that light is produced by radiative recombination of the carriers in said bowl-shaped portion of said second layer with the light being guided by said first and third layers due to the lower index of refraction of said materials of said first and third layers relative to said material of said second layer.

2. The laser of claim 1 wherein said first and third layers are of the same material.

3. The laser of claim 2 wherein said second layer is GaAs, and said first and third layers are GaAlAs.

4. The laser of claim 2 wherein said first layer in n-type and said second and third layers are p-type such that said rectifying junction exists between said first and second layers.

5. The laser of claim 1 wherein said means for restricting the path of pump current flow are additional rectifying jucntions disposed on each side of said groove and formed at the interface between said substrate and said first layer, said additional junctions being back biased when said first rectifying junction is forward biased.

6. The laser of claim 5 wherein said additional rectifying junctions are formed by a diffused layer within said substrate at said surface of said substrate, said diffused layer having a conductivity type different than the conductivity type of said first layer.

7. The laser of claim 1 wherein said means for restricting the path of pump current flow are separate non-conducting regions located on each side of said groove in said surface of said substrate.

8. The laser of claim 1 wherein said groove in said surface of said substrate has sloping sidewalls.

9. The laser of claim 1 wherein the bottom of said groove makes an angle of less than 180° with the sloping sidewalls of said groove.

10. The laser of claim 1 wherein said second layer has substantially planar portions on each side of said bowl-shaped portion with said planar portions being coupled to said bowl-shaped portion with additional portions of said second layer which are thinner than said planar portions of said second layer.

11. The laser of claim 1 wherein the width of said bowl-shaped portion of said second layer is on the same order of magnitude as the height of said bowl-shaped portion.

12. A heterojunction diode laser for producing a substantially symmetrically output light beam comprising:

a substrate body of a semiconductor material having a surface with an elongated groove formed in said surface, a first layer of a semiconductor material in integral contact with said surface of said substrate, said first layer having a substantially planar portion on each side of said groove and a portion within said groove with a surface of said portion within said groove inwardly arched toward said substrate body, a second layer of a semiconductor material in integral contact with said first layer, said second layer having a central portion substantially within said groove and substantially planar portions on each side of said central portion, said central portion having a surface conforming to the shape of said inwardly arched surface of said first layer and a substantially flat surface adjacent said inwardly arched surface, a third layer of semiconductor material in integral contact with said second layer, said material of said second layer having an index of refraction greater than the index of refraction of both the material of said first layer and the material of said third layer to thereby provide a heterogeneous laser, at least two of said first, second and third layers being of a different conductivity type such that a rectifying junction exists between two of said first, second and third layers, and means located on both sides of said groove formed in said surface of said substrate for restricting the flow of pump current to a path through said central portion of said layer when said rectifying junction is forward biased to thereby achieve population inversion in said central portion of said second layer such that light is produced by radiative recombination of the carriers in said central portion of said second layer with the light being guided by said first and third layers due to the lower index of refraction of the materials of said first and third layers relative to the material of said second layer.

13. The laser of claim 12 wherein said first and third layers are of the same material.

14. The laser of claim 13 wherein said second layer is GaAs, and said first and third layers are GaAlAs.

15. The laser of claim 13 wherein said first layer in n-type and said second and third layers are p-type such that said rectifying junction exists between said first and second layers.

16. The laser of claim 12 wherein said means for restricting the path of pump current flow are additional rectifying junctions disposed on each side of said groove and formed at the interface between said substrate and said first layer, said additional junctions being back biased when said first rectifying junction is forward biased.

17. The laser of claim 16 wherein said additional rectifying junctions are formed by a diffused layer within said substrate at said surface of said substrate, said diffused layer having a conductivity type different than the conductivity type of said first layer.

18. The laser of claim 16 wherein said means for restricting the path of pump current flow are separate non-conducting regions located on each side of said groove in said surface of said substrate.

19. The laser of claim 12 wherein said groove in said surface of said substrate has sloping sidewalls.

20. The laser of claim 12 wherein the bottom of said groove makes an angle of less than 180° with the sloping sidewalls of said groove.

21. The laser of claim 1 wherein said central portion of said second layers is coupled to said substantially planar portions of said second layer by additional portions of said second layer which are thinner than said substantially planar portions of said second layer.

22. The laser of claim 12 wherein the width of said central portion of said second layer is on the same order of magnitude as the height of said central portion of said second layer.

23. A heterojunction diode laser comprising:
a substrate body having a surface with an elongated groove formed in said surface,
a first layer of a first material deposited on said surface, said first layer having a surface configuration remote from said surface of substrate with a portion which is concave toward said substrate within a substantial portion of said groove,
a second layer of a second material deposited on said first layer, said second material having an index of refraction greater than said first material, said second layer having substantially planar portions on both sides of said groove and a substantially bowl-shaped portion substantially within said groove and in contact with said concave portion of said surface of said first layer remote from said substrate,
a third layer of a third material deposited on said second layer, said third material having a lower index of refraction than said second material,
at least two of said first, second and third layers being of a different conductivity type such that a rectifying junction exists between two of said first, second and third layers, and
means located on both sides of said groove formed in said surface of said substrate for restricting the flow of pump current to a path through said groove and through said bowl-shaped portion of said second layer when said rectifying junction is forward biased to thereby achieve population inversion in said bowl-shaped portion of said second layer such that light is produced by radiative recombination of the carriers in said bowl-shaped portion of said second layer with the light being guided by said first and third layers due to the lower index of refraction of said materials of said first and third layers relative to said material of said second layer.

* * * * *

UNITED STATES PATENT AND TRADEMARK OFFICE
CERTIFICATE OF CORRECTION

PATENT NO. : 3,978,428
DATED : August 31, 1976
INVENTOR(S) : Robert D. Burnham, Donald R. Scifres It is certified that error appears in the above-identified patent and that said Letters Patent are hereby corrected as shown below:

Column 2, line 5, change "note" to --not--.

Column 6, lines 22 and 23, change "heterorjunction" to --heterojunction--.

Column 8, line 42, before "layer" insert --second--.

Signed and Sealed this

Thirteenth Day of September 1977

[SEAL]

Attest:

RUTH C. MASON
Attesting Officer

LUTRELLE F. PARKER
Acting Commissioner of Patents and Trademarks